(12) United States Patent
Yamaguchi

(10) Patent No.: US 8,531,838 B2
(45) Date of Patent: Sep. 10, 2013

(54) TELEVISION APPARATUS AND ELECTRONIC DEVICE

(75) Inventor: Akifumi Yamaguchi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 297 days.

(21) Appl. No.: 13/083,210

(22) Filed: Apr. 8, 2011

(65) Prior Publication Data

US 2011/0310315 A1    Dec. 22, 2011

(30) Foreign Application Priority Data

Jun. 18, 2010   (JP) .................................. 2010-139841

(51) Int. Cl.
*H05K 7/20* (2006.01)
*H04N 5/64* (2006.01)

(52) U.S. Cl.
USPC .................. 361/688; 361/679.47; 361/679.48; 361/679.52; 361/679.54; 361/695; 361/697; 361/700; 165/80.3; 165/104.26; 165/104.33; 165/121; 165/122; 165/185; 454/184

(58) Field of Classification Search
USPC ....... 361/679.46–679.54, 688, 689, 692–697, 361/704–719, 721–727, 825, 831; 345/84, 345/87; 348/836, E5.128; 349/60–65, 20, 349/58, 161; 313/11, 13, 17, 22–25, 35, 313/36, 44, 46; 165/80.2–80.5, 104.14, 104.26, 165/104.33, 121–126, 185; 312/223.2, 223.3, 312/236

See application file for complete search history.

(56) References Cited

U.S. PATENT DOCUMENTS

| | | | | |
|---|---|---|---|---|
| 7,672,123 B2 * | 3/2010 | Tatsukami | ............... | 361/679.54 |
| 7,740,054 B2 * | 6/2010 | Yang | ........................ | 165/104.33 |
| 7,830,660 B2 * | 11/2010 | Kang et al. | .................... | 361/695 |
| 7,830,663 B2 * | 11/2010 | Iikubo | ............................ | 361/697 |
| 7,903,402 B2 * | 3/2011 | Tomioka et al. | ......... | 361/679.47 |
| 2004/0001316 A1 * | 1/2004 | Kamikawa et al. | ........... | 361/700 |

(Continued)

FOREIGN PATENT DOCUMENTS

| | | |
|---|---|---|
| JP | 04-008492 | 1/1992 |
| JP | 2003-025935 | 1/2003 |

(Continued)

OTHER PUBLICATIONS

Japanese Patent Application No. 2010-139841; Notice of Rejection; Mailed Jun. 28, 2011 (with English translation).

(Continued)

*Primary Examiner* — Michail V Datskovskiy
(74) *Attorney, Agent, or Firm* — Blakely, Sokoloff, Taylor & Zafman LLP

(57) ABSTRACT

According to one embodiment, a television apparatus includes an exothermic component, a heat transfer mechanism, a plurality of heat releasing fins, a fan, and a deflecting member. The exothermic component is housed in a housing. The heat transfer mechanism is at least partially housed in the housing. The heat transfer mechanism includes a heat receiving portion that receives heat from the exothermic component, a heat releasing portion that releases heat, and a heat transferring portion that houses a medium to transfer heat from the heat receiving portion to the heat releasing portion. The heat releasing fins are thermally connected to the heat releasing portion and arranged with gaps therebetween. The fan generates an air flow flowing through the gaps. The deflecting member is located at least downstream of the gaps to cover the gaps. The deflecting member deflects the air flow toward an exhaust outlet formed in the housing.

8 Claims, 9 Drawing Sheets

(56) References Cited

U.S. PATENT DOCUMENTS

| | | | |
|---|---|---|---|
| 2005/0248920 A1* | 11/2005 | Huang | 361/696 |
| 2007/0146988 A1* | 6/2007 | Yamagishi et al. | 361/687 |
| 2008/0083527 A1* | 4/2008 | Horng et al. | 165/80.3 |
| 2009/0219695 A1* | 9/2009 | Tomioka | 361/700 |
| 2010/0079947 A1* | 4/2010 | Aoki | 361/695 |
| 2010/0294462 A1* | 11/2010 | Lin et al. | 165/80.3 |
| 2010/0294463 A1* | 11/2010 | Nie et al. | 165/80.3 |

FOREIGN PATENT DOCUMENTS

| | | | |
|---|---|---|---|
| JP | 02003017881 A * | 1/2003 | |
| JP | 2003-101272 | 4/2003 | |
| JP | 2006-147618 | 6/2006 | |
| JP | 2008-015440 | 1/2008 | |
| JP | 2008-165101 | 7/2008 | |
| JP | 02009064349 A * | 3/2009 | |
| JP | 2009-175523 | 8/2009 | |
| JP | 2009-192728 | 8/2009 | |
| JP | 2010-134117 | 6/2010 | |
| JP | 2010-134197 | 6/2010 | |
| WO | WO03/067949 | 8/2003 | |

OTHER PUBLICATIONS

Japanese Patent Application No. 2010-139841; Notice of Rejection; Mailed Apr. 17, 2012 (with English translation).

Japanese Patent Application No. 2010-139841; Notice of Rejection; Mailed Nov. 8, 2011 (with English translation).

Japanese Patent Application No. 2010-139841; Decision to Grant a Patent; Mailed Aug. 21, 2012 (with English translation).

* cited by examiner

TELEVISION APPARATUS AND ELECTRONIC DEVICE

CROSS-REFERENCE TO RELATED APPLICATIONS

This application is based upon and claims the benefit of priority from Japanese Patent Application No. 2010-139841, filed Jun. 18, 2010, the entire contents of which are incorporated herein by reference.

FIELD

Embodiments described herein relate generally to a television apparatus and an electronic device.

BACKGROUND

Typically, electronic devices are known in which an air flow generated by a fan inside the housing is first made to pass through a heat releasing portion of a heat transfer mechanism and then discharged through an exhaust outlet that is formed on an outer wall of the housing.

With regard to such electronic devices, there is a demand for enhancing the efficiency in discharging heat along with the air flow to the outside of the housing.

BRIEF DESCRIPTION OF THE SEVERAL VIEWS OF THE DRAWINGS

A general architecture that implements the various features of the invention will now be described with reference to the drawings. The drawings and the associated descriptions are provided to illustrate embodiments of the invention and not to limit the scope of the invention.

DETAILED DESCRIPTION

Figure 1:
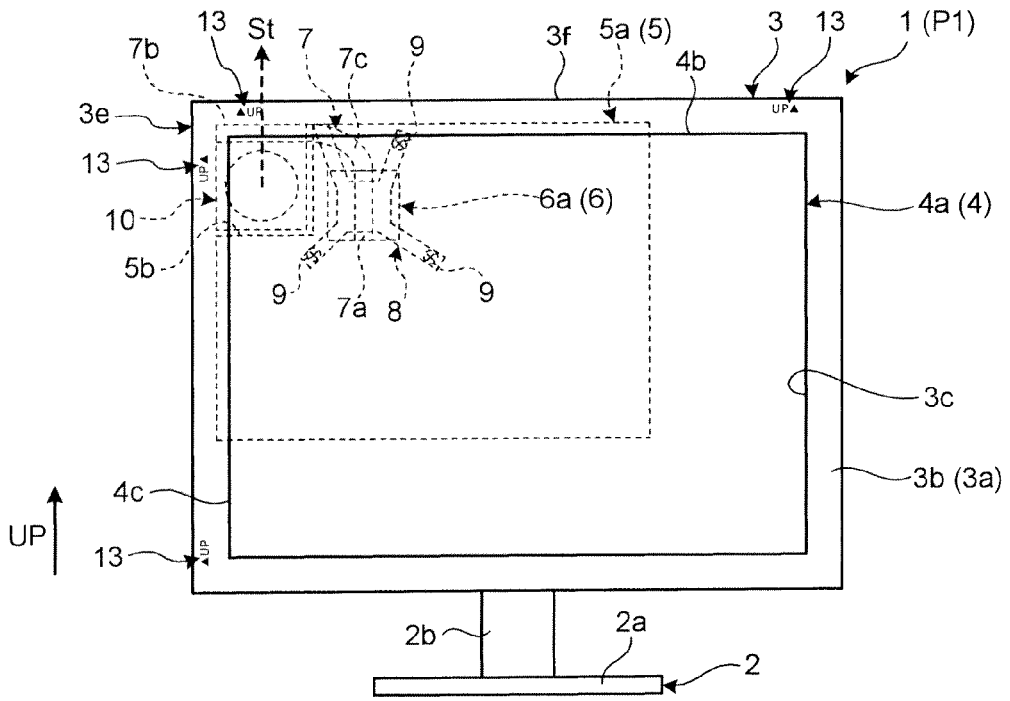
FIG. 1 is an exemplary front view of a first orientation of a television apparatus as an electronic device according to a first embodiment.

In general, according to one embodiment, a television apparatus comprises an exothermic component, a heat transfer mechanism, a plurality of heat releasing fins, a fan, and a deflecting member. The exothermic component is housed in a housing. The heat transfer mechanism is at least partially housed in the housing. The heat transfer mechanism comprises a heat receiving portion configured to receive heat from the exothermic component, a heat releasing portion configured to release heat, and a heat transferring portion configured to house a medium that transfers heat from the heat receiving portion to the heat releasing portion. The heat releasing fins are configured to be thermally connected to the heat releasing portion and arranged with gaps therebetween. The fan is configured to generate an air flow that flows through the gaps. The deflecting member is located at least downstream of the gaps to laterally cover the gaps. The deflecting member is configured to deflect the air flow toward an exhaust outlet formed in the housing.

According to one embodiment, an electronic device comprises an exothermic component, a heat transfer mechanism, a plurality of heat releasing fins, a fan, and a deflecting member. The exothermic component is housed in a housing. The heat transfer mechanism is at least partially housed in the housing. The heat transfer mechanism comprises a heat receiving portion configured to receive heat from the exothermic component, a heat releasing portion configured to release heat, and a heat transferring portion configured to house a medium that transfers heat from the heat receiving portion to the heat releasing portion. The heat releasing fins are configured to be thermally connected to the heat releasing portion and arranged with gaps therebetween. The fan is configured to generate an air flow that flows through the gaps. The deflecting member is located at least downstream of the gaps to laterally cover the gaps. The deflecting member is configured to deflect the air flow toward an exhaust outlet formed in the housing.

In the embodiments and modifications thereof described below, the identical constituent elements are referred to by the same reference numerals, and repetition is avoided in the explanation of such constituent elements. In the accompanying drawings, "UP" represents the upper side in the operating state.

Figure 2:
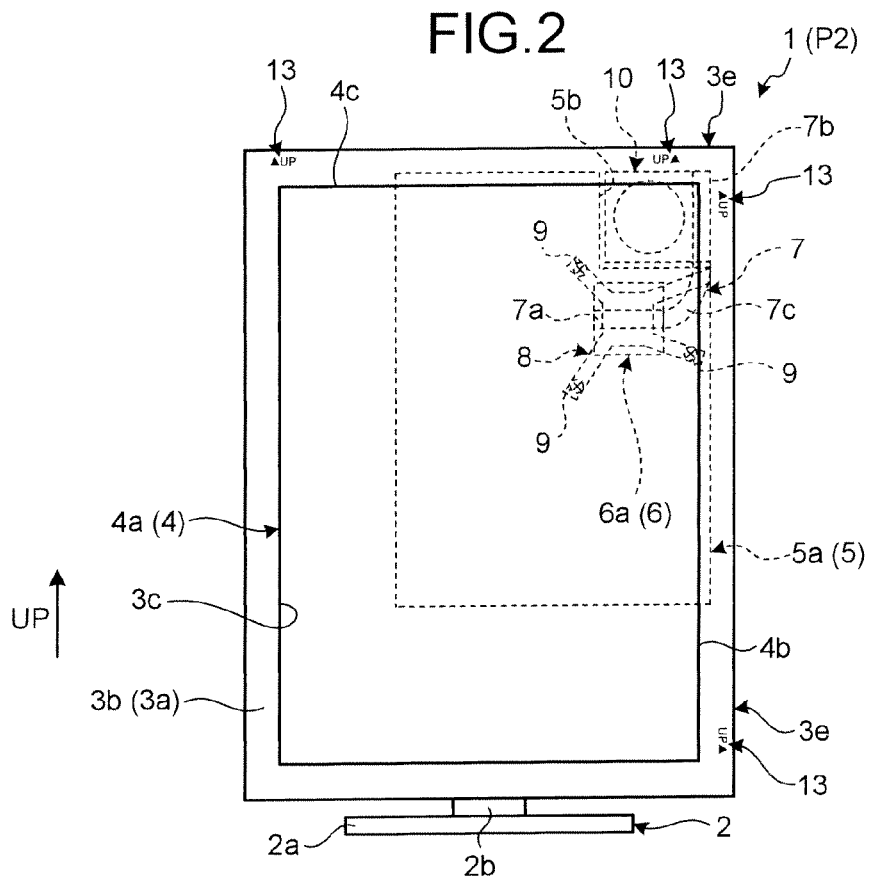
FIG. 2 is an exemplary front view of a second orientation of the television apparatus in the first embodiment.

As illustrated in FIGS. 1 and 2, a television apparatus 1 as an electronic device according to a first embodiment comprises a stand 2 and a main body 3 that is supported by the stand 2.

The stand 2 has a base 2a and a leg 2b that extends from the base 2a to the rear side of the central portion of the main body 3. To the fore-end (not illustrated) of the leg 2b, the tail end (rear end) (not illustrated) of a housing 3a of the main body 3 is rotatably supported via a hinge mechanism (not illustrated) made of, for example, ball joints or universal joints. The television apparatus 1 has a pivot function, with which the television apparatus 1 can be used in a landscape-style first orientation P1 (FIG. 1) in which a side 4b of a display screen 4a is positioned on the upper side, and can be used in a portrait-style second orientation P2 (FIG. 2) in which another side 4c of the display screen 4a is positioned on the upper side. On a front face 3b of the housing 3a is disposed a display element 13 for the purpose of displaying a symbol or a character representing the orientation (for example, the upper side) that is set at the time of use. That enables the user to recognize whether the first orientation P1 or the second orientation P2 is set.

The main body 3 comprises a display panel 4 such as a liquid crystal display (LCD) and a circuit board 5a. The display panel 4 is a display device (display) having the display screen 4a exposed anteriorly from an opening 3c formed on the front face 3b of the housing 3a. The circuit board 5a has electronic components such as a central processing unit (CPU) 6 mounted thereon. The display panel 4 and the circuit board 5a are fixed to the housing 3a with screws or the like (not illustrated). The circuit board 5a and the electronic components (CPU 6 or the like) (not illustrated) mounted on the circuit board 5a constitute a circuit board assembly 5. In FIGS. 1 and 2, the electronic components other than the CPU 6 are not illustrated.

The display panel 4 is formed in the shape of a thin and flat rectangular parallelepiped along the front-back direction (perpendicular direction to the plane of paper of FIG. 1). The display panel 4 receives video signals from a video signal processing circuit (not illustrated), which is one of the control circuits (not illustrated) configured with the electronic components mounted on the circuit board 5a. Then, the display panel 4 displays video including still images and moving images on the display screen 4a that is positioned in the front. Apart from the video signal processing circuit, the control circuits (not illustrated) in the television apparatus 1 include a tuner module, a high-definition multimedia interface (HDMI) signal processing module, an audio-video (AV) input terminal, a remote control signal receiving module, a control module, a selector, an on-screen display interface, a memory module (such as a read only memory (ROM), a random access memory (RAM), or a hard disk drive (HDD)), and an audio signal processing circuit. The circuit board 5a (the circuit board assembly 5) is housed behind (on the rear side of) the display panel 4 inside the housing 3a. Meanwhile, the television apparatus 1 has built-in amplifiers or speakers (not illustrated) for the purpose of audio output.

As illustrated in FIGS. 1 and 2, the CPU 6 that is an exothermic electronic component is mounted on the circuit board 5a. On the die (not illustrated) of the CPU 6 is mounted a heat releasing block 6a, and on the heat releasing block 6a is mounted a heat receiving portion 7a of a heat pipe 7 that functions as a heat transfer mechanism. The heat receiving portion 7a is pressed against the heat releasing block 6a with a pressing member 8, which is fixed to the circuit board 5a using screws 9 as fastening members. In such a configuration, the heat generated by the exothermic CPU 6 is transferred to the heat receiving portion 7a via the heat releasing block 6a.

The heat pipe 7 functioning as the heat transfer mechanism is a pipe having, for example, an elongated flattened cross-section and is made of a metallic component (such as copper alloy) having relatively high heat conductivity. One end of that pipe constitutes the heat receiving portion 7a, while the other end thereof constitutes a heat releasing portion 7b. The portion in between the heat receiving portion 7a and the heat releasing portion 7b is a heat transferring portion 7c. On the outside of the heat releasing portion 7b are attached fins (i.e., heat releasing fins, not illustrated in FIGS. 1 and 2) that are made of thin sheets of a metallic component (such as copper alloy) having relatively high heat conductivity. Moreover, inside the housing 3a, at a position adjacent to the heat releasing portion 7b is installed a fan 10 that has a thin flat appearance in the thickness direction of the circuit board 5a and that comprises a rotor (not illustrated) rotating around a rotary shaft positioned along the perpendicular direction to the front and rear faces of the circuit board 5a. The rotor of the fan 10 is rotated using an electric motor so that, for example, the air that is taken in from the housing 3a through air inlets (not illustrated) formed on both sides of the axial direction of the rotary shaft (i.e., formed on the front side and on the rear side) is discharged through an exhaust outlet (not illustrated) formed opposite to the heat releasing portion 7b. That is, the air flow discharged by the fan 10 reaches the heat releasing portion 7b and the fins, as a result of which the heat releasing portion 7b and the fins are subjected to cooling. Meanwhile, the fan 10 is fit in an L-shaped notch 5b formed at a corner of the circuit board 5a.

Within the heat pipe 7 is enclosed a heat transfer medium such as the alternative for chlorofluorocarbon having relatively high volatility. Inside the heat pipe 7, the heat transfer medium at the heat receiving portion 7a first evaporates into gas due to the heat generated by the CPU 6, then reaches the heat releasing portion 7b in the gaseous state via the heat transferring portion 7c, and then condenses to liquid by getting cooled at the heat releasing portion 7b. The heat transfer medium in the liquid state returns from the heat releasing portion 7b to the heat receiving portion 7a via the heat transferring portion 7c, and evaporates into gas at the heat receiving portion 7a. Thus, the heat transfer medium absorbs latent heat at the heat receiving portion 7a and releases that latent heat at the heat releasing portion 7b. As a result, the heat gets transferred from the heat receiving portion 7a to the heat releasing portion 7b. That is, the heat generated by the exothermic CPU 6 is transferred to the heat releasing portion 7b via the heat receiving portion 7a and the heat transferring portion 7c (through the heat transfer medium flowing therein) and is then transferred from the heat releasing portion 7b into the air flow, which is then discharged to the outside of the housing 3a through an exhaust outlet 3d formed therein.

As can be seen in FIGS. 1 and 2 according to the present embodiment, in the first orientation P1 (FIG. 1) as well as in the second orientation P2 (FIG. 2), the heat receiving portion 7a is positioned on the lower side of the heat releasing portion 7b. In the heat pipe 7 functioning as the heat transfer mechanism, in case the heat receiving portion 7a is positioned on the upper side of the heat releasing portion 7b thereby forming what is called a top heat condition, the heat transfer medium in the liquid state does not easily return to the heat receiving portion 7a from the heat releasing portion 7b. That causes a decline in the heat transfer efficiency, that is, in the heat releasing efficiency. In view of this, in the present embodiment, the heat receiving portion 7a is positioned on the lower side of the heat releasing portion 7b in both of the first orientation P1 (FIG. 1) and the second orientation P2 (FIG. 2) that are defined to be the correct orientations. Hence, it becomes possible to prevent the heat transfer efficiency, that is, the heat releasing efficiency from declining.

Moreover, in the present embodiment, the heat releasing portion 7b is disposed at a corner 3e that lies at the upper end of the housing 3a in the first orientation P1 (FIG. 1) and in the second orientation P2 (FIG. 2). Since the heat is prone to rise inside the housing 3a due to the air current, disposing the heat releasing portion 7b at the corner 3e, which lies at the upper end of the housing 3a in both of the first orientation P1 and in the second orientation P2, makes it possible to prevent heat accumulation from occurring inside the housing 3a.

Figure 3:
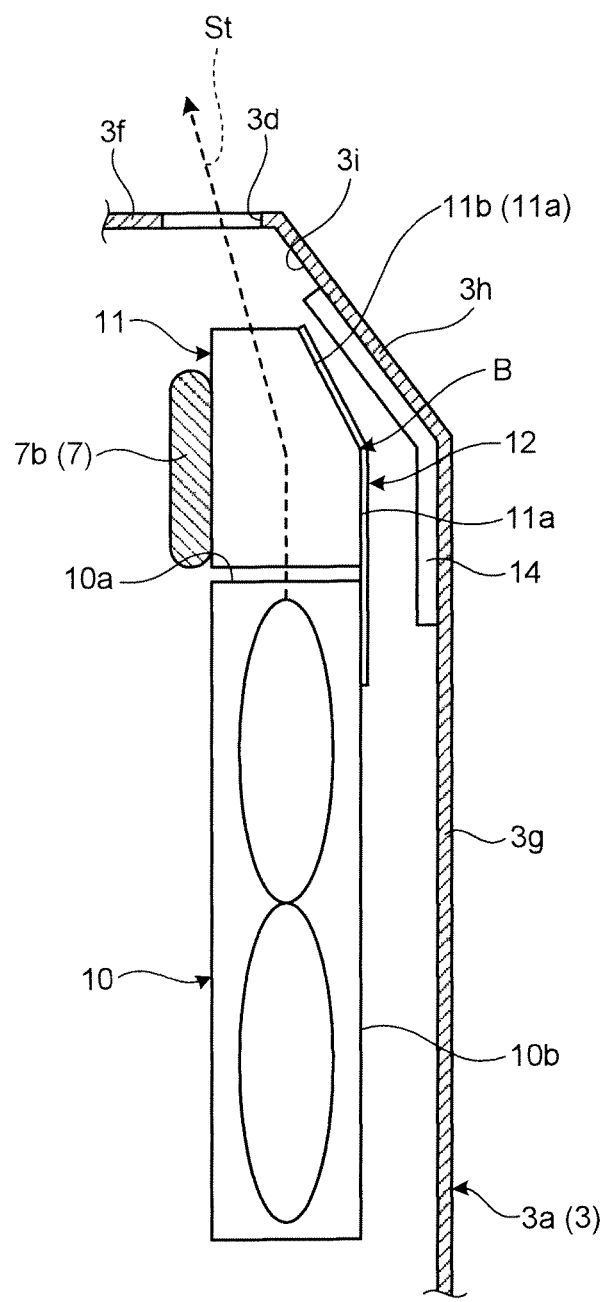
FIG. 3 is an exemplary schematic cross-sectional view of a portion inside the television apparatus in the first embodiment.

As illustrated in FIG. 3, the exhaust outlet 3d is formed on a top wall 3f that constitutes the outer wall of the housing 3a. Herein, airflow St generated by the fan 10 reaches fins 11, which are positioned above the fan 10 and are thermally connected to the heat releasing portion 7b, before being discharged through the exhaust outlet 3d. In the present embodiment, the fins 11 are joined to the pipe wall of the heat releasing portion 7b by means of, for example, soldering. To the heat releasing portion 7b, the fins 11 are linked in a thermal manner, that is, in a thermally-conductive state. The fins 11 can be made of a metallic component such as aluminum alloy having relatively high heat conductivity. Meanwhile, along the air flow generated by the fan 10, the plurality of fins 11 are arranged spaced apart from each other in the longitudinal direction of the heat releasing portion 7b (perpendicular direction to the plane of paper of FIG. 3). The fins 11 are arranged parallel to each other so that the airflow St generated by the fan 10 passes through the plurality of gaps (not illustrated) formed in between the fins 11.

As illustrated in FIG. 3, in the present embodiment, an outlet 10a of the fan 10 and the exhaust outlet 3d of the housing 3a are kept out of alignment in the direction (front-back direction of the main body 3, horizontal direction in FIG. 3) that is perpendicular to the discharging direction (upper direction in FIG. 3) of the air flow from the fan 10. In such a configuration, if no additional measures are taken, then the air flow discharged from the fan 10 reaches a portion of the outer wall of the housing 3a (i.e., in the present embodiment, the air flow reaches an inclined wall 3h above a back wall 3g). In that case, the conduction resistance of the air flow increases and the air flow that gets heated while passing through the fins 11 reaches the housing 3a. That may cause warming of the housing 3a.

In view of this, in the present embodiment, a deflecting member 12 is attached to the fins 11 for the purpose of deflecting the airflow St toward the exhaust outlet 3d. In the present embodiment, the deflecting member 12 is a film-like member or a plate-like member made of a synthetic resin material having lower heat conductivity than that of the fins 11. Moreover, in the first embodiment, as part of a margin 11a at the downstream portion of each fin 11 and on the opposite side of the heat releasing portion 7b, an inclined margin 11b is formed that has an inclination with respect to the outlet 10a of the fan 10 in the direction along the downstream side of the airflow St toward the exhaust outlet 3d of the housing 3a. The margin 11a on the upstream side of the inclined margin 11b lies parallel to the margin on the side of the heat releasing portion 7b. The deflecting member 12 abuts against the margin 11a including the inclined margin 11b of each fin 11. Moreover, the deflecting member 12 is fixed to at least one margin 11a (for example, to a plurality of the margins 11a, to one of the margins 11a, or to all of the margins 11a) by means of adhesive bonding in a bent manner at a boundary B between the inclined margin 11b and the margin 11a that lies parallel to the inclined margin 11b. That is, the deflecting member 12 is disposed along the inclined margin 11b to laterally cover the gaps formed in between the plurality of fins 11 (in the present embodiment, disposed to cover the rearward of the opposite side of the heat releasing portion 7b).

In the abovementioned configuration according to the present embodiment, since the deflecting member 12 allows the airflow St to flow toward the exhaust outlet 3d, it becomes possible to prevent the airflow St from reaching the outer wall of the housing 3a. Moreover, since the deflecting member 12 lies along the margins 11a including the inclined margins 11b of the fins 11 and preferably abuts against the margins 11a, the airflow St is prevented from leaking through the gaps formed in between the deflecting member 12 and the fins 11. That makes it possible to prevent the heat releasing efficiency from declining, which is likely to happen due to the leakage of the airflow St. Furthermore, in the present embodiment, since the deflecting member 12 is fixed to the margins 11a by means of adhesion bonding, the configuration by which the deflecting member 12 blocks the gaps formed in between the plurality of fins 11 can be achieved in a relatively simpler manner. Besides, the deflecting member 12 is also fixed to a cover 10b, which serves as the casing for the fan 10, and laterally (in a rearward manner in the present embodiment) covers the gaps formed in between the fan 10 and the fins 11. Consequently, it becomes possible to prevent the heat releasing efficiency from declining, which is likely to happen due to the leakage of the airflow St through the gaps formed in between the fan 10 and the fins 11. In addition, as compared to the case when the deflecting member 12 is fixed only to the margins 11a of the fins 11, the abovementioned configuration has the advantage of increased bonding strength. Moreover, in the present embodiment, because of the film-like nature or the plate-like nature, the deflecting member 12 can be made to be thinner so that the apparatus configuration does not increase in size due the deflecting member 12. Meanwhile, the deflecting member 12 need not be bonded to the margins 11a of all of the fins 11, and can be bonded to the margins 11a of only few of the fins 11 or can only be partially bonded to each margin 11a or can be bonded to some of the plurality of fins 11 (e.g., to the fins 11 at the ends of the arrangement and to the fin 11 at the center). Moreover, the deflecting member 12 can also be fixed to the fins 11, the fan 10, the housing 3a, or the circuit board 5a by means of engagement. Furthermore, the deflecting member 12 can be formed by molding synthetic resin or can be formed to be detachable with partial or entire elastic deformation.

In the present embodiment, the margins 11a of the fins 11 and the deflecting member 12 are formed spaced apart on the side of an inner face 3i of the back wall 3g and the inclined wall 3h, which constitute the outer wall of the housing 3a. Thus, an air layer is present in between the outer wall of the housing 3a and the deflecting member 12. Consequently, as compared to the case when the deflecting member 12 abuts against the inner face 3i of the outer wall, warming of the housing 3a can be prevented from occurring.

Moreover, in the present embodiment, a heat shield 14 that has a strong heat shielding property and that is made of, for example, the fluorine contained resin is disposed in between the inner face 3i of the outer wall and the deflecting member 12. The heat shield 14 is fixed on the inner face 3i by means of adhesion bonding. By disposing the heat shield 14, warming of the housing 3a can be further prevented from occurring.

Figure 4:
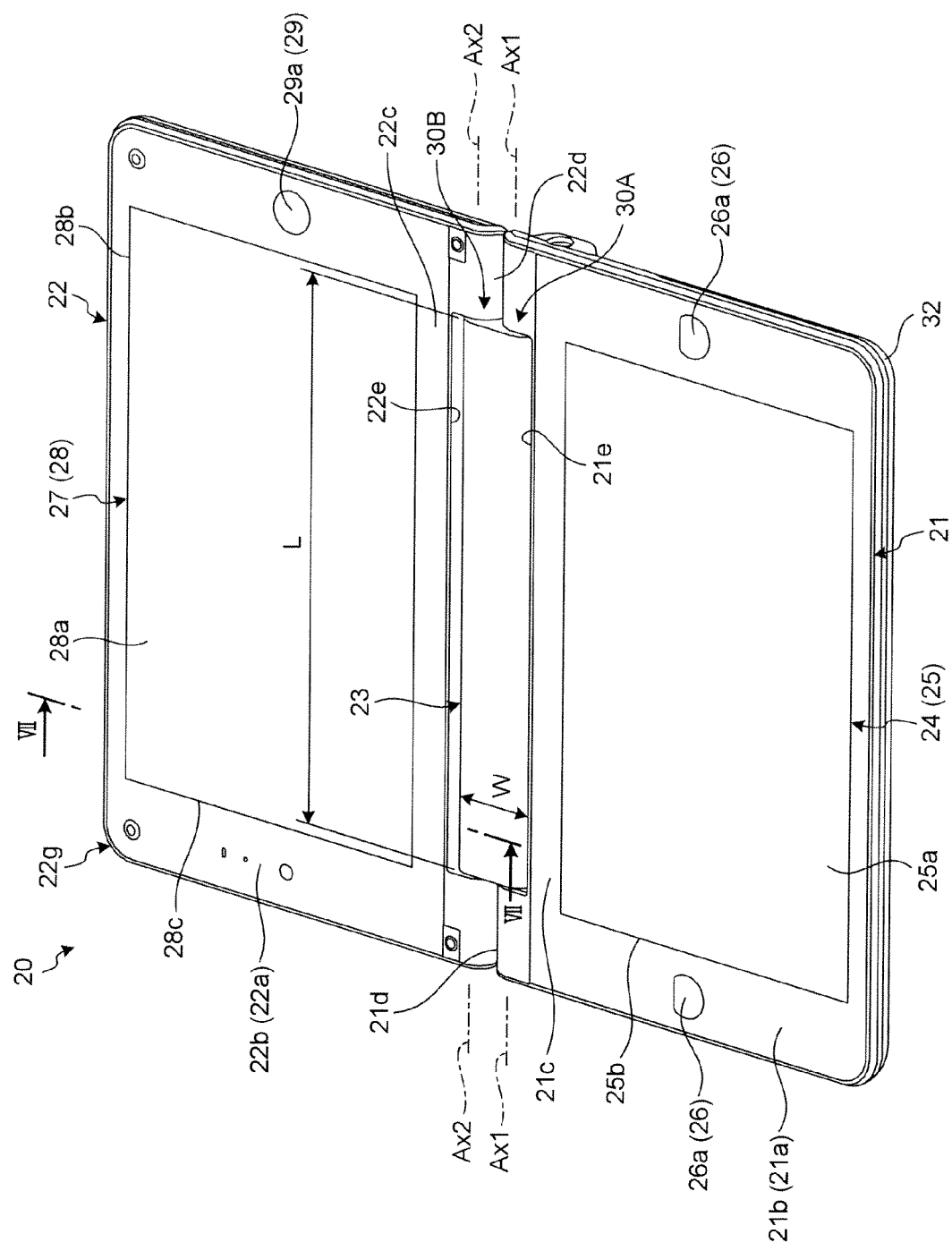
FIG. 4 is an exemplary perspective view of an open state of a personal computer (PC) as an electronic device according to a second embodiment.

According to a second embodiment, a notebook personal computer (PC) 20 as an electronic device comprises a rectangular and flat first main body 21 and a rectangular and flat second main body 22 as illustrated in FIG. 4. The first main body 21 and the second main body 22 are connected in a relatively rotatable manner via a joint 23.

In the first main body 21, a display panel 25 such as an LCD, which is a display device having a touch panel 24 on the front face (i.e., on a display screen 25a), and a push button mechanism 26 are arranged in an exposed manner on a front face 21b that is the external face of a housing 21a. Similarly, in the second main body 22, a display panel 28 such as an LCD, which is a display device having a touch panel 27 on the front face (i.e., on a display screen 28a), and a push button mechanism 29 are arranged in an exposed manner on a front face 22b that is the external face of a housing 22a.

In the open state illustrated in FIG. 4, the display panel 25 and cover bodies 26a of the push button mechanism 26 as well as the display panel 28 and a cover body 29a of the push button mechanism 29 lie in an exposed condition. In such a state, the user is able to perform operations. In contrast, in a folded state (not illustrated), the front faces 21b and 22b face each other from up close in such a way that the display panel 25 and the cover bodies 26a of the push button mechanism 26 are hidden by the housing 21a, while the display panel 28 and the cover body 29a of the push button mechanism 29 are hidden by the housing 22a. In the present embodiment, the touch panels 24 and 27, the push button mechanisms 26 and 29, and a microphone (not illustrated) function as input operation modules, while the display panels 25 and 28 and speakers (not illustrated) function as output operation modules. Meanwhile, in the PC having a keyboard, or click buttons, or a pointing device (not illustrated), the keyboard or the click buttons also function as input operation modules.

The joint 23 connects the first main body 21 with the second main body 22, and is configured separately from the first main body 21 and the second main body 22. The joint 23 connects an end portion 21c at the base end of the first main body 21 with an end portion 22c at the base end of the second main body 22. At the central part in the longitudinal direction of an end edge 21d of the end portion 21c and at the central part in the longitudinal direction of an end edge 22d of the end portion 22c, rectangular notches 21e and 22e are formed, respectively, except over the respective ends. Each of the rectangular notches 21e and 22e has a long opening along the longitudinal direction and has only a shallow depth. Half of the joint 23 is inserted in the notch 21e and the remaining half thereof is inserted in the notch 22e. A length L of the joint 23 is set to be slightly shorter than the width of the notches 21e and 22e. Moreover, a width W of the joint 23 is set to be substantially equal to the thickness when the first main body 21 and the second main body 22 are closed together in the folded state.

The first main body 21 and the joint 23 are connected in a relatively rotatable manner around a rotation axis Ax1 via a first hinge mechanism 30A. Similarly, the second main body 22 and the joint 23 are connected in a relatively rotatable manner around a rotation axis Ax2 via a second hinge mechanism 30B. The rotary shafts Ax1 and Ax2 lie parallel to each other. In the present embodiment, the first hinge mechanism 30A and the second hinge mechanism 30B are coupled together so that the relative rotation angle around the rotation axis Ax1 of the first main body 21 with respect to the joint 23 is identical to the relative rotation angle around the rotation axis Ax2 of the second main body 22 with respect to the joint 23. However, the two relative rotation directions with respect to the joint 23 are opposite to each other. Thus, when the user operates the joint 23 for the purpose of opening either one of the first main body 21 and the second main body 22, the PC 20 falls into the open state. Similarly, when the joint 23 is operated for the purpose of closing either one of the first main body 21 and the second main body 22, the PC 20 falls into the folded state. Moreover, when the user opens the first main body 21 and the second main body 22, the PC 20 falls into the open state. Similarly, when the first main body 21 and the second main body 22 are closed, the PC 20 falls into the folded state.

Figure 5:
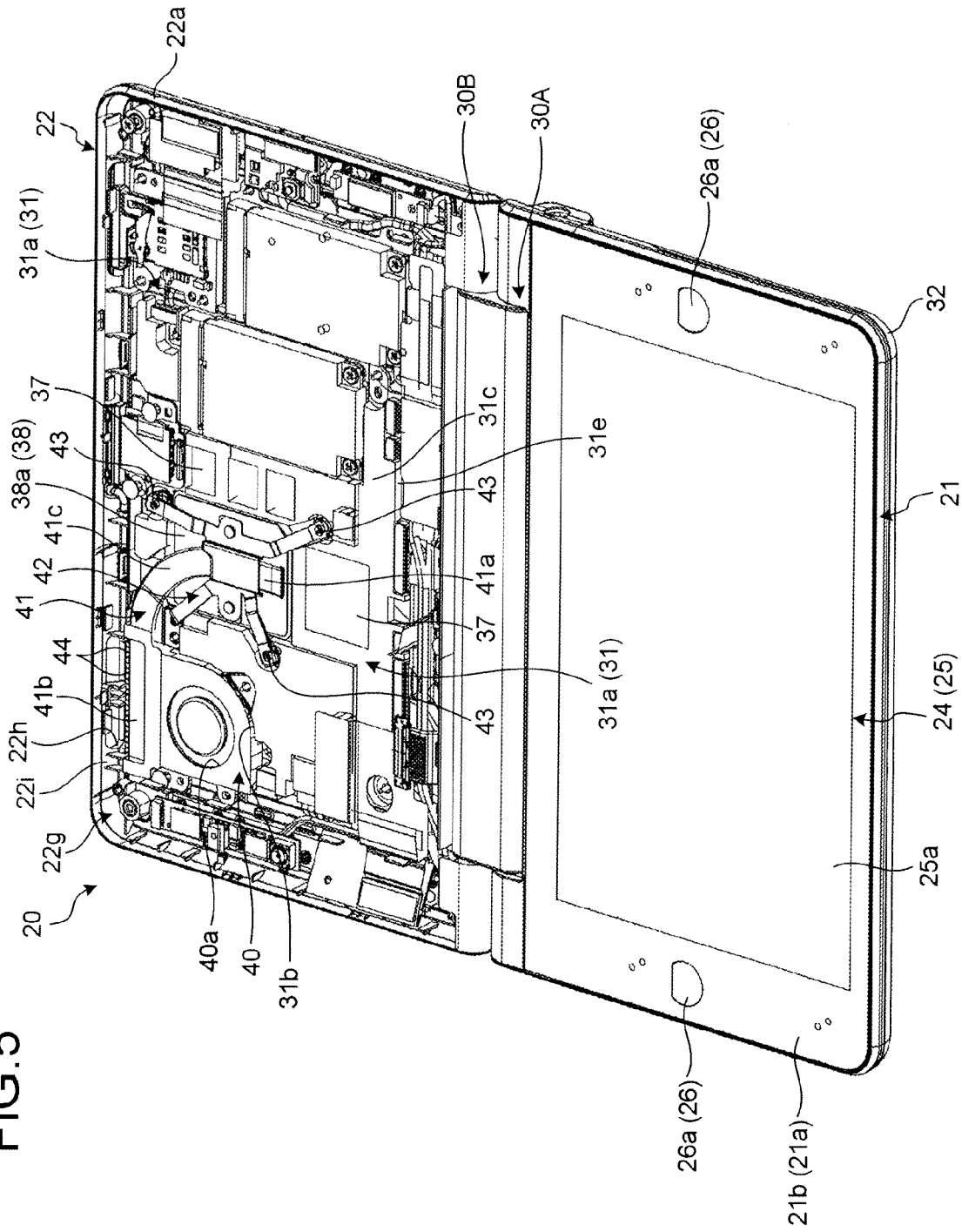
FIG. 5 is an exemplary perspective view of the PC illustrated in FIG. 4 without a display panel of a second main body in the second embodiment.

In the present embodiment, as illustrated in FIG. 5, a circuit board 31a (a circuit board assembly 31) with at least some of the control circuits including electronic components mounted thereon is disposed, for example, inside the housing 22a of the second main body 22. In the housing 22a, the display panel 28 and the circuit board 31a are fixed with screws or the like (not illustrated). Meanwhile, as illustrated in FIGS. 4 and 5, in the first main body 21, a battery 32 is disposed as a power supply behind (on the rear side of) the display panel 25. On the rear side of the first main body 21, a depressed portion is formed that is rectangular in appearance when viewed from the back. The depressed portion gets covered by the battery 32 when the battery 32 is detachably attached to the housing 21a of the first main body 21. Thus, in the present embodiment, the circuit board 31a (the circuit board assembly 31) with the main electronic components such as a CPU 38 mounted thereon is disposed in the second main body 22, while the battery 32 is disposed in the first main body 21. In case the circuit board assembly 31 and the battery 32 are disposed together in either one of the first main body 21 and the second main body 22, then following inconveniences are more likely to occur. For example, the thickness of the main bodies increases or, if there is a restriction on the thickness, then it becomes necessary to reduce the size and eventually the capacity of the battery 32. In contrast, in the present embodiment, the circuit board assembly 31 and the battery 32 are separately disposed in the second main body 22 and the first main body 21, respectively. That makes it possible to avoid the abovementioned inconveniences. In this regard, however, the first main body 21 is larger in mass than the second main body 22 so that the PC 20, that is, the first main body 21 can be stably placed on a desk or the like. In the present embodiment, the first main body 21 corresponds to a different main body that is connected to the second main body 22, which houses the circuit board assembly 31, in a relatively rotatable manner via the hinge mechanisms 30A and 30B. Moreover, the display screen 25a of the display panel 25 in the first main body 21 corresponds to a different display screen.

Figure 6A:
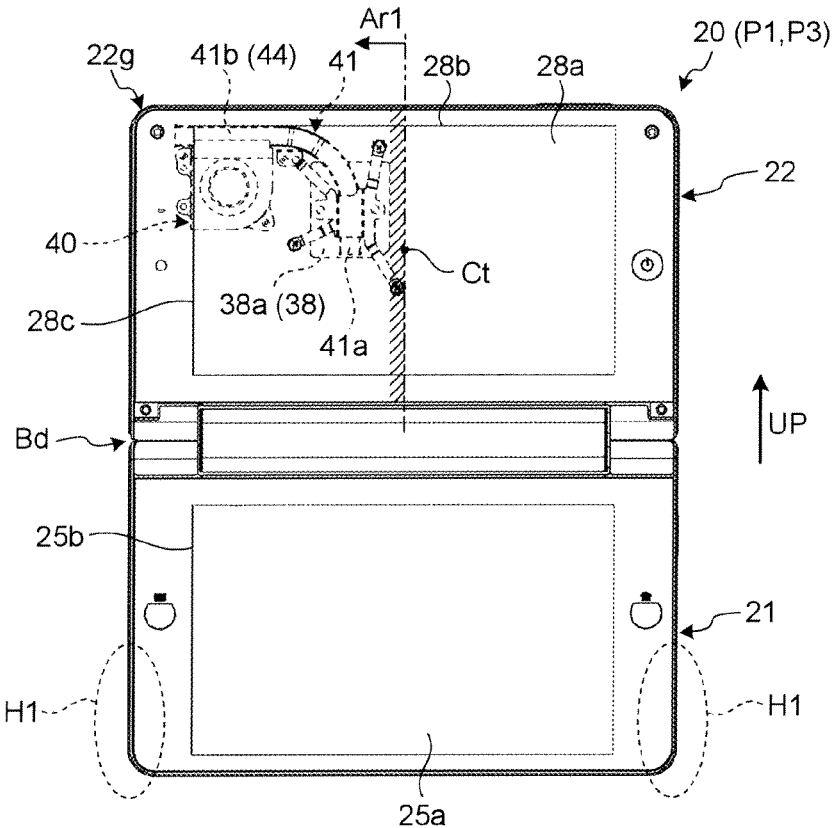
FIG. 6A is an exemplary plan view of a first orientation of the PC in the second embodiment.

Apart from a first usage pattern in which the PC 20 according to the present embodiment is placed on desk, the PC 20 can also be used in a second usage pattern in which lower ends H1 of the margin portion of the first main body 21 in the orientation illustrated in FIG. 6A (first orientation P1) are held with the hands. In addition, the PC 20 can also be used in a third usage pattern in which the right margin portion in FIG. 6A of the first main body 21 and the second main body 22 in the orientation illustrated in FIG. 6A is held with the hands at lower ends H2 in the orientation illustrated in FIG. 6B (second orientation P2) Meanwhile, in the second usage pattern, the user holding the first main body 21 with the hands can operate the push button mechanism 26 with the thumbs.

Thus, the PC 20 according to the present embodiment can be used in the first orientation P1 (see FIG. 6A) in which a side 28b of the display screen 28a of the display panel 28 is positioned on the upper side and can be used in the second orientation P2 (see FIG. 6B) in which another side 28c of the display screen 28a of the display panel 28 as well as a side 25b of the display screen 25a of the display panel 25 are positioned on the upper side. The side 28b of the display screen 28a is distantly positioned from a boundary Bd between the first main body 21 and the second main body 22, while the other side 28c of the display screen 28a and the side 25b of the display screen 25a are positioned to face each other across the boundary Bd. In the present embodiment, the first orientation P1 for the two display screen 28a also represents a third orientation P3 for the display screens 28a and 25a, while the second orientation P2 for the display screen 28a also represents a fourth orientation P4 for the two display screens 28a and 25a.

Herein, each of the display panels 25 and 28 is formed in the shape of a flat rectangular parallelepiped, and receives display signals from control circuits (not illustrated) configured with the electronic components mounted on the circuit board 31a. Moreover, each of the display panels 25 and 28 displays video including still images and moving images. In the present embodiment, the light that represents the video displayed on the display screens 25a and 28a of the display panels 25 and 28, respectively, is output anteriorly via the display panels 25 and 28, respectively, which are colorless and transparent in nature. The control circuits in the PC 20 include a control module, a memory module (such as a ROM, a RAM, or an HDD), an interface circuit, and various controllers. Meanwhile, the PC 20 also has built-in speakers (not illustrated) for the purpose of audio output.

As illustrated in FIG. 5, the CPU 38 that is an exothermic electronic component is mounted on the circuit board 31a. On the die (not illustrated) of the CPU 38 is mounted a heat releasing block 38a, and on the heat releasing block 38a is mounted a heat receiving portion 41a of a heat pipe 41 that functions as a heat transfer mechanism. The heat receiving portion 41a is pressed against the heat releasing block 38a with a pressing member 42, which is fixed to the circuit board 31a using a screw 43 that is a fastening member. In such a configuration, the heat generated by the exothermic CPU 38 is transferred to the heat receiving portion 41a via the heat releasing block 38a.

The heat pipe 41 functioning as the heat transfer mechanism is a pipe having, for example, an elongated flattened cross-section and is made of a metallic component (such as copper alloy) having relatively high heat conductivity. One end of that pipe constitutes the heat receiving portion 41a, while the other end thereof constitutes a heat releasing portion 41b. The portion in between the heat receiving portion 41a and the heat releasing portion 41b is a heat transferring portion 41c. On the outside of the heat releasing portion 41b are attached a plurality of fins 44 that are made of thin sheets of a metallic component (such as copper alloy) having relatively high heat conductivity. Moreover, inside the housing 22a, at a position adjacent to the heat releasing portion 41b is installed a fan 40 that has a thin flat appearance in the thickness direction of the circuit board 31a and that comprises a rotor (not illustrated) rotating around a rotary shaft positioned along the perpendicular direction to the front and rear sides of the circuit board 31a. The rotor of the fan 40 is rotated using an electric motor so that, for example, the air that is taken in from the housing 22a through air inlets 40a formed on both sides of the axial direction of the rotary shaft (i.e., formed on the front side and on the rear side) is discharged through an exhaust outlet (not illustrated) formed opposite the heat releasing portion 41b. That is, the air flow discharged by the fan 40 reaches the heat releasing portion 41b and the fins 44, as a result of which the heat releasing portion 41b and the fins 44 are subjected to cooling. Meanwhile, the fan 40 is fit in an L-shaped notch 31b formed at a corner of the circuit board 31a. Herein, the heat pipe 41 functions in an identical manner to the heat pipe 7 according to the first embodiment.

Figure 6B:
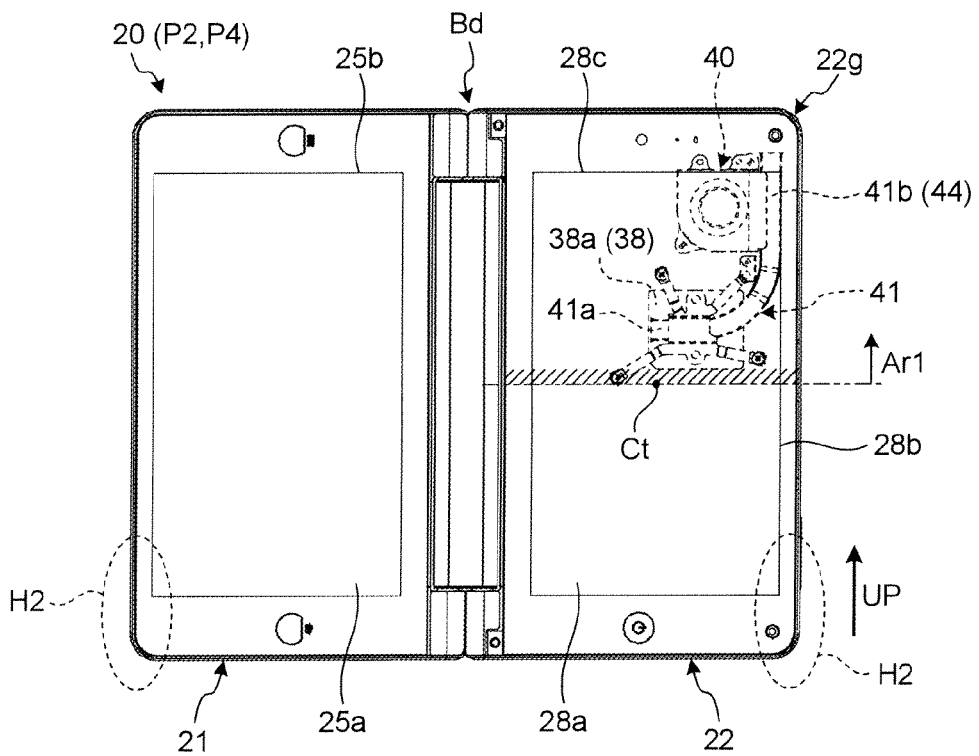
FIG. 6B is an exemplary plan view of a second orientation of the PC in the second embodiment.

As illustrated in FIG. 6, in the present embodiment also, the heat receiving portion 41a is positioned on the lower side of the heat releasing portion 41b in both of the first orientation P1 (FIG. 6A) and the second orientation P2 (FIG. 6B) in an identical manner to the first embodiment. In the heat pipe 41 functioning as the heat transfer mechanism, in case the heat receiving portion 41a is positioned on the upper side of the heat releasing portion 41b thereby forming what is called a top heat condition, then the heat transfer medium in the liquid state does not easily return to the heat receiving portion 41a from the heat releasing portion 41b. That causes a decline in the heat transfer efficiency, that is, in the heat releasing efficiency. In view of this, in the present embodiment, the heat receiving portion 41a is positioned on the lower side of the heat releasing portion 41b in both of the first orientation P1 and the second orientation P2 that are defined to be the correct orientations. Hence, it becomes possible to prevent the heat transfer efficiency, that is, the heat releasing efficiency from declining, which may happen if the heat receiving portion 41a is positioned on the upper side of the heat releasing portion 41b. Meanwhile, in order to notify the user about the first orientation P1 and the second orientation P2, the control module refers to the detection result of an orientation sensor (not illustrated) disposed inside the housing 22a of the second main body 22 and accordingly displays video corresponding to the first orientation P1 and video corresponding to the second orientation P2 on the display screens 25a and 28a. Moreover, at least on one of the first main body 21 and the second main body 22, an orientation notifying element such as a rough portion or a display element can be disposed for the purpose of notifying the user about the first orientation P1 and the second orientation P2.

Moreover, as illustrated in FIGS. 5 and 6, in the present embodiment also, the heat releasing portion 41b is disposed at a corner 22g that lies at the upper end of the housing 22a in both of the first orientation P1 and the second orientation P2. Since the heat is prone to rise inside the housing 22a due to the air current, disposing the heat releasing portion 41b at the corner 22g that lies at the upper end of the housing 3a in both of the first orientation P1 and the second orientation P2 makes it possible to prevent heat accumulation from occurring inside the housing 22a.

Furthermore, as illustrated in FIG. 5, in the present embodiment, an exhaust outlet 22h is formed on a side wall 22i at the corner 22g of the housing 22a. Thus, the air flow, which is generated by the fan 40 and which gets heated by passing through the heat releasing portion 41b formed at the corner 22g, is discharged more smoothly from the exhaust outlet 22h that is formed at the corner 22g of the housing 22a and that faces the heat releasing portion 41b from up close. As a result, heat accumulation is prevented from occurring inside the housing 22a.

As illustrated in FIG. 6, in the present embodiment, when viewed from the front of the display screen 28a (i.e., when viewed along the line of sight of FIG. 6), the exothermic CPU 38 is disposed in a rectangular area Ar1 that lies on the upper side of the center Ct of the second main body 22 in the second orientation P2. Hence, the ascending air current generated inside the housing 22a due to the heat of the exothermic CPU 38 or the air flow drawn in the fan 40 travels a relatively long distance inside the housing 22a. AS a result, it becomes possible to prevent occurrence of a situation in which the electronic components disposed over a wide area inside the housing 22a are easily affected due to the heat. Moreover, if it is assumed that the exothermic CPU 38 lies at the center Ct, then there is a possibility that the heated air accumulates in the area on the opposite side of the exhaust outlet 22h with respect to the center Ct inside the housing 22a (i.e., on the opposite side of the corner 22g). In view of this, in the present embodiment, in both of the first orientation P1 and the second orientation P2, the exothermic CPU 38 is disposed in the area on the side of the exhaust outlet 22h with respect to the center Ct (i.e., on the side of the corner 22g). Consequently, the heated air can be easily discharged to the outside of the housing 22a. Moreover, in the present embodiment, at the time of holding the second main body 22 with the hands, usually the user holds with the hands an area H on the opposite side of the rectangular area An positioned on the lower side of the center Ct in each orientation. That is, the user happens to hold with the hands the area H that is distantly positioned from the CPU 38 or the heat pipe 41. Therefore, the user is spared from holding with the hands that area of the housing 22a which becomes warm due to the heat from the CPU 38 or the heat pipe 41. Thus, while holding the PC 20 with the hands, the user is spared from experiencing any sense of discomfort that may occur due to the warming of the housing 22a.

Figure 7:
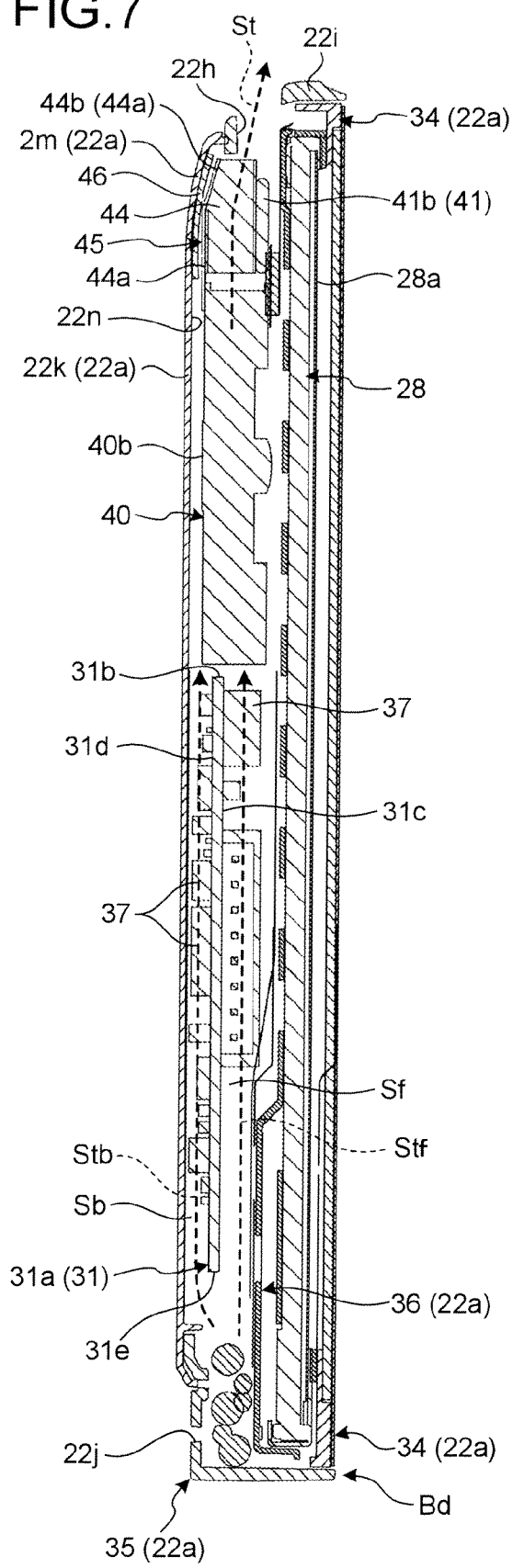
FIG. 7 is an exemplary cross-sectional view along line VII-VII in FIG. 4 in the second embodiment.
Figure 8:
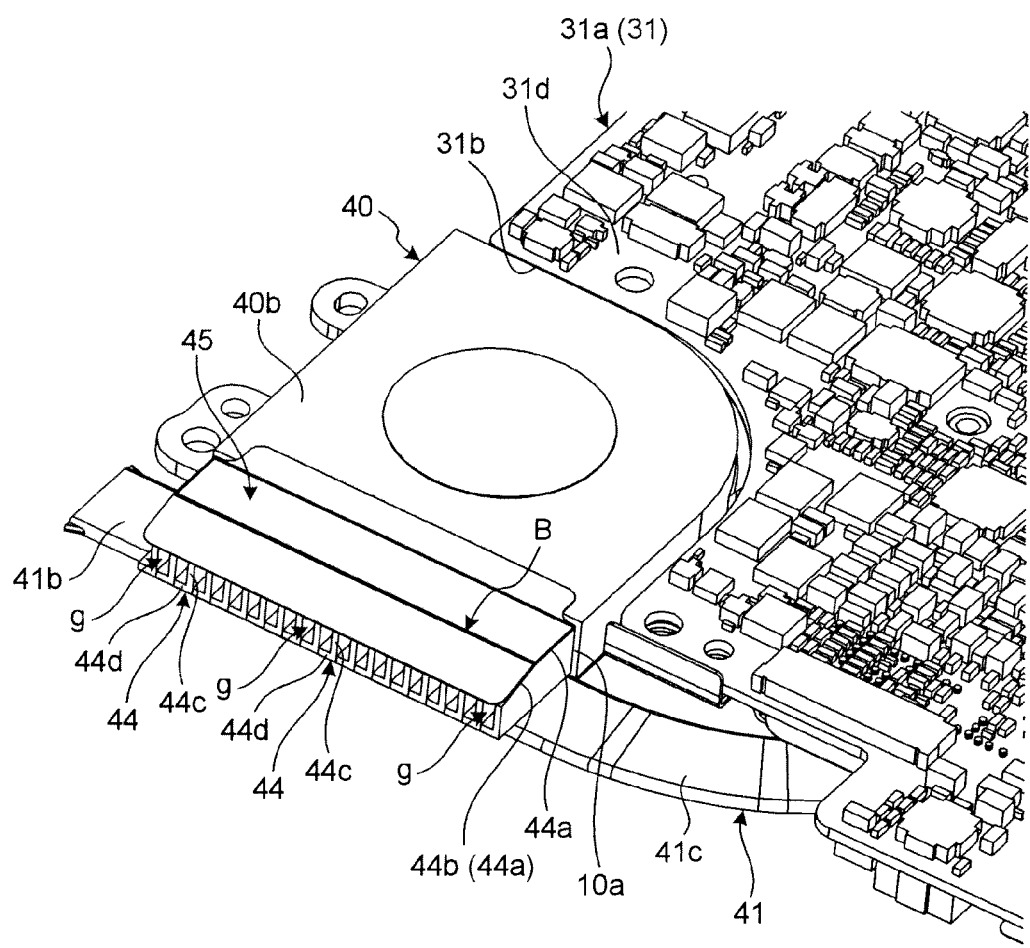
FIG. 8 is an exemplary perspective view, when viewed from behind (rear side), of a portion inside the second main body of the PC in the second embodiment.

Moreover, in the present embodiment, as illustrated in FIG. 7, air inlets 22*j* are formed close to the boundary Bd between the first main body 21 and the housing 22*a* of the second main body 22. Thus, in the present embodiment, since the air inlets 22*j* are distantly positioned from the exhaust outlet 22*h*, a wider area inside the housing 22*a* is subjected to cooling by the air flow that is let inside the housing 22*a* from the air inlets 22*j* and that flows toward the exhaust outlet 22*h*.

Furthermore, as illustrated in FIG. 7, the air inlets 22*j* are formed on the outer side of the circuit board 31*a*, that is, on the outside (downside in FIG. 7) of an end edge 31*e* of the circuit board 31*a* in the direction along the surface of the circuit board 31*a*. As a result, the air flow let in from the air inlets 22*j* gets easily distributed in the space on the front side and the space on the rear side of the circuit board 31*a* (in a front side space Sf and a rear side space Sb). Because of airflow Stf flowing in the space Sf and airflow Stb flowing in the space Sb, the electronic components installed on the front side and on the rear side are subjected to cooling without difficulty. Meanwhile, it is also possible to form the air inlets 22*j* opposite to the end edge 31*e* of the circuit board 31*a*.

As illustrated in FIG. 7, the housing 22*a* of the second main body 22 comprises a mask 34 and a casing 35 constituting the outer housing and comprises an inner plate 36 as the inner housing. The mask 34 and the casing 35 constituting the outer housing are integratedly coupled by screwing, engagement, or fitting, and form the outline of the housing 22*a*. The inner plate 36 as the inner housing is screw-clamped to the mask 34 or the casing 35 (herein, for example, the casing 35) constituting the outer housing. The housing 22*a* houses the display panel 28 that has the display screen 28*a* exposed on the front side, and also houses the circuit board assembly 31. The inner plate 36 is disposed in between the display panel 28 and the circuit board 31*a* (the circuit board assembly 31), that is, disposed at a position that is behind the display panel 28 (i.e., on the left side in FIG. 7) and that is in front of the circuit board 31*a*. To the inner plate 36, the circuit board 31*a* is fixed using a screw (not illustrated) that is a fastening member. Moreover, the display panel 28 is supported by the inner plate 36 and the mask 34.

The circuit board 31*a* is formed to be rectangular in shape when viewed from the front of the display screen 28*a* and has the notch 31*b* formed thereon as illustrated in FIGS. 5 and 7. Moreover, in the present embodiment, as illustrated in FIG. 7, a plurality of electronic components 37 are mounted on a front face 31*c* and a rear face (reverse face) 31*d* of the circuit board 31*a*. In the present embodiment, the relatively taller electronic components 37 are mounted on the front face 31*c*, while the relatively shorter electronic components 37 are mounted on the rear face 31*d*. Thus, as compared to the case when the relatively taller electronic components 37 are mounted on the front face 31*c* as well as on the rear face 31*d*, the height (thickness) of the circuit board assembly 31 comprising the circuit board 31*a* and the electronic components 37 can be prevented from increasing.

In the present embodiment also, the fins 44, a deflecting member 45, and a heat shield 46 are disposed in an identical manner to the first embodiment. As illustrated in FIG. 7, the exhaust outlet 22*h* is formed on the side wall 22*i* that constitutes the outer wall of the housing 22*a*. . Thus, the air flow that is generated by the fan 40 reaches the fins 44, which lie above the fan 40 and which are thermally connected to the heat releasing portion 41*b*, and then gets discharged from the exhaust outlet 22*h*.

Figure 9:
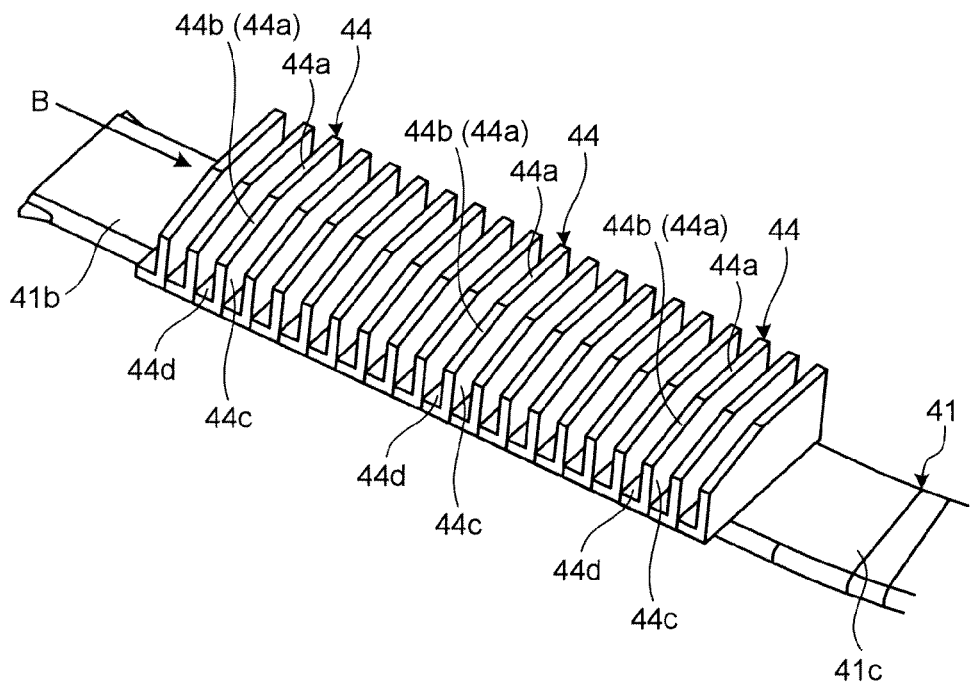
FIG. 9 is an exemplary perspective view of fins arranged inside the second main body of the PC in the second embodiment.

In the present embodiment, as illustrated in FIG. 9, each fin 44 has an L-shaped cross section, and has a partition wall portion 44*c* serving as the partition wall between adjacent gaps g and a side wall portion 44*d* bending in right angle at that margin of the corresponding partition wall portion 44*c* which lies on the side of the heat releasing portion 41*b* and protruding with a certain height. The side wall portions 44*d* are closely lined side by side on the pipe wall of the heat releasing portion 41*b* and are joined to the pipe wall by means of, for example, soldering. Thus, as illustrated in FIG. 9, a configuration can be achieved in which the partition wall portions 44*c* of the plurality of fins 44 are arranged spaced apart from each other in the longitudinal direction of the heat releasing portion 41*b* (perpendicular direction to the plane of paper of FIG. 7). The partition wall portions 44*c* of the plurality of fins 44 are arranged parallel to each other so that the airflow St generated by the fan 40 passes through the gaps g formed in between the plurality of partition wall portions. To the heat releasing portion 41*b*, the fins 44 are linked in a thermal manner, that is, in a thermally-conductive state. Moreover, the fins 44 can be made of a metallic component such as aluminum alloy having relatively high heat conductivity.

In the present embodiment also, as illustrated in FIG. 7, the outlet 10*a* of the fan 40 and the exhaust outlet 22*h* of the housing 22*a* are kept out of alignment in the direction (front-back direction of the second main body 22, horizontal direction in FIG. 7) that is perpendicular to the discharging direction (upper direction in FIG. 7) of the air flow from the fan 40. In such a configuration, if no additional measures are taken, then the air flow discharged from the fan 40 reaches a portion of the outer wall of the housing 22*a* (i.e., in the present embodiment, the air flow reaches an inclined wall 22*m* above a back wall 22*k*). In that case, the conduction resistance of the air flow increases and the air flow that gets heated while passing through the fins 44 reaches the housing 22*a*. That may cause warming of the housing 22*a*.

In view of this, in the present embodiment, the deflecting member 45 is attached to the fins 44 for the purpose of deflecting the airflow St toward the exhaust outlet 22*h*. In the present embodiment, the deflecting member 45 is a film-like member or a plate-like member made of a synthetic resin material having lower heat conductivity than that of the fins 44. Moreover, in the present embodiment, as illustrated in FIG. 9, as part of a margin 44*a* at the downstream portion of each fin 44 and on the opposite side of the heat releasing portion 41*b*, an inclined margin 44*b* is formed that has an inclination with respect to the outlet 10*a* of the fan 40 in the direction along the downstream side of the airflow St toward the exhaust outlet 22*h* of the housing 22*a*. The margin 44*a* on the upstream side of the inclined margin 44*b* lies parallel to the margin on the side of the heat releasing portion 41*b*. The deflecting member 45 abuts against the margin 44*a* including the inclined margin 44*b* of each fin 44. Moreover, the deflecting member 45 is fixed to the margins 44*a* by means of adhesive bonding in a bent manner at the boundary B between the inclined margin 44*b* and the margin 44*a* that lies parallel to the inclined margin 44*b*. That is, the deflecting member 45 is disposed to laterally cover the gaps g formed in between the plurality of fins 44 (in the present embodiment, disposed to cover the rearward of opposite side of the heat releasing portion 41*b*).

In the abovementioned configuration according to the present embodiment also, since the deflecting member 45 allows the airflow St to flow toward the exhaust outlet 22*h*, it becomes possible to prevent the airflow St from reaching the outer wall of the housing 22*a*. Moreover, since the deflecting member 45 abuts against the margins 44*a* including the inclined margins 44*b* of the fins 44, the airflow St is prevented from leaking through the gaps g formed in between the deflecting member 45 and the fins 44. That makes it possible to prevent the heat releasing efficiency from declining, which is likely to happen due to the leakage of the airflow St. Furthermore, in the present embodiment, since the deflecting member 45 is fixed to the margins 44a by means of adhesion bonding, the configuration by which the deflecting member 45 blocks the gaps g formed in between the plurality of fins 44 can be achieved in a relatively simpler manner. Besides, the deflecting member 45 is also fixed to a cover 40b, which serves as the casing for the fan 40, and laterally (in a rearward manner in the present embodiment) covers the gaps g formed in between the fan 40 and the fins 44. Consequently, it becomes possible to prevent the heat releasing efficiency from declining, which is likely to happen due to the leakage of the airflow St through the gaps g formed in between the fan 40 and the fins 44. In addition, as compared to the case when the deflecting member 45 is fixed only to the margins 44a of the fins 44, the abovementioned configuration has the advantage of increased bonding strength. Moreover, in the present embodiment, because of the film-like nature or the plate-like nature, the deflecting member 45 can be made to be thinner so that the apparatus configuration does not increase in size due the deflecting member 45.

In the present embodiment, the margins 44a of the fins 44 and the deflecting member 45 are formed spaced apart on the side of an inner face 22n of the back wall 22k and the inclined wall 22m, which constitute the outer wall of the housing 22a. Thus, an air layer is present in between the outer wall of the housing 22a and the deflecting member 45. Consequently, as compared to the case when the deflecting member 45 abuts against the inner face 22n of the outer wall, warming of the housing 22a can be prevented from occurring.

Moreover, in the present embodiment, the heat shield 46 that has a strong heat shielding property and that is made of, for example, the fluorine contained resin is disposed in between the inner face 22n of the outer wall and the deflecting member 45. The heat shield 46 is fixed on the inner face 22n by means of adhesion bonding. By disposing the heat shield 46, warming of the housing 22a can be further prevented from occurring.

Figure 10:
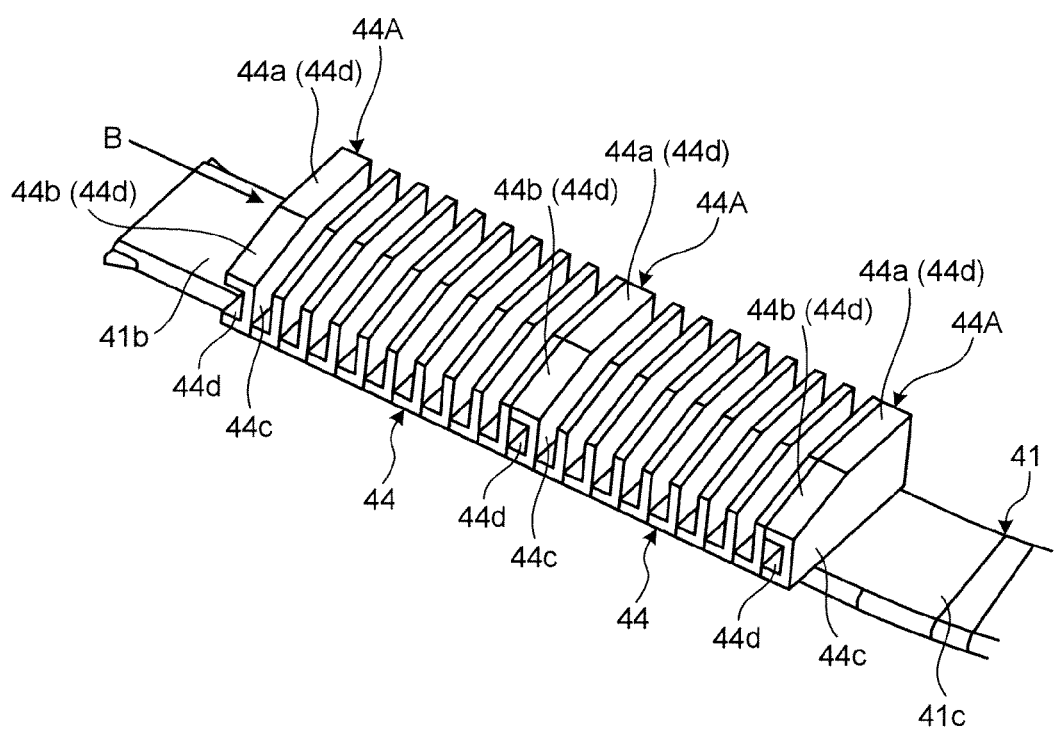
FIG. 10 is an exemplary perspective view of fins arranged inside the second main body of the PC according to a first modification of the second embodiment.

Described below is a first modification of the second embodiment. As illustrated in FIG. 10, in the first modification, fins 44A are substituted for some of the fins 44 described in the second embodiment. Each fin 44A has a U-shaped cross section, and has the partition wall portion 44c and a mutually-facing pair of side wall portions 44d bending in right angle at that margin of the corresponding partition wall portion 44c which lies on the side of the heat releasing portion 41b and protruding with a certain height. Such fins 44A are arranged at the ends and at the center of the arrangement of the fins 44 and 44A. The side wall portions 44d that lie on the opposite side of the heat releasing portion 41b can be used as the bonding faces for the deflecting member 45. Hence, as compared to the second embodiment, it becomes possible to increase the area over which the fins 44 and 44A are bonded with the deflecting member 45. That enables achieving increased bonding strength of the deflecting member 45 with respect to the fins 44 and 44A. Meanwhile, apart from the abovementioned explanation, the remaining configuration is identical to that in the second embodiment. Hence, it is possible to achieve the same effect as achieved in the second embodiment.

Figure 11:
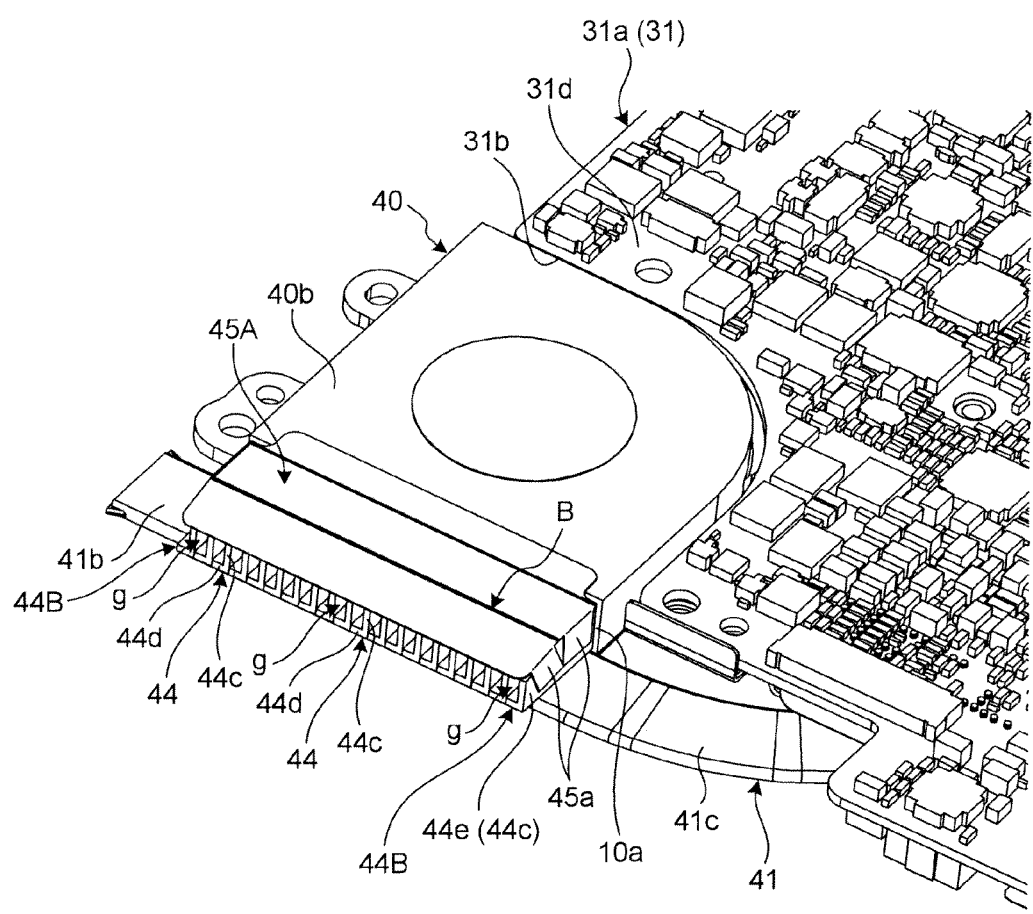
FIG. 11 is an exemplary perspective view, when viewed from behind (rear side), of a portion inside the second main body of the PC according to a second modification of the second embodiment.

Described below is a second modification of the second embodiment. As illustrated in FIG. 11, in the second modification, a deflecting member 45A is folded at the margin 44a that is an end edge of a fin 44B disposed at the end of the arrangement of the fins 44, and a folded end 45a of the deflecting member 45A is fixed to a surface 44e of the partition wall portion 44c of the fin 44B. Thus, the surface of the partition wall portion 44c of the fin 44B can be used as the bonding face for the deflecting member 45A. Hence, as compared to the second embodiment, it becomes possible to increase the area over which the fins 44 and 44B are bonded with the deflecting member 45A. That enables achieving increased bonding strength of the deflecting member 45A with respect to the fins 44 and 44B. Meanwhile, apart from the abovementioned explanation, the remaining configuration is identical to that in the second embodiment. Hence, it is possible to achieve the same effect as achieved in the second embodiment.

While the abovementioned embodiments are described as being applied to a television apparatus or a notebook PC having two display screens, the embodiments may be applicable to other electronic devices having at least a single display screen such as computers (notebook computers or desktop computers), personal digital assistants (PDAs), smartbooks, or cellular phones having a single display screen.

Moreover, regarding the electronic device, the housing, the exothermic component, the heat transfer mechanism, the heat releasing fin, the fan, the deflecting member, the exhaust outlet, the inclined margin, the margin, the outer wall, the distance, the heat shield, the casing, the end edge of the heat releasing fin, the partition wall portion, the side wall portion, and the surface, the specifications (method, structure, shape, material, size, number, direction, type, arrangement, position, etc.) can be suitably modified.

The various modules of the systems described herein can be implemented as software applications, hardware and/or software modules, or components on one or more computers, such as servers. While the various modules are illustrated separately, they may share some or all of the same underlying logic or code.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic device comprising:
    a housing provided with a first exhaust outlet;
    an exothermic component housed in the housing;
    a fan comprising a second exhaust outlet, and configured to discharge air from the second exhaust outlet;
    a plurality of heat releasing fins positioned between the second exhaust outlet and the first exhaust outlet at a side of the second exhaust outlet in a direction toward which the air is discharged from the second exhaust outlet, thermally connected to the exothermic component, and comprising first margins arranged with gaps therebetween and arranged along a direction toward which the air is discharged and second margins inclined with respect to the first margins in a direction toward which the first exhaust outlet is positioned and arranged along a portion of an outer wall of the housing; and
    a deflecting member positioned at the outer wall side of the second margins, has heat conductivity lower than heat conductivity of the heat releasing fins, comprising a first part configured to cover the gaps over the first margins and a second part connected to the first part and configured to cover the gaps over the second margins, and configured to direct the air from the second exhaust outlet toward the first exhaust outlet,
wherein at least a portion of the first exhaust outlet is positioned off from a direction toward which the air is discharged from the second exhaust outlet.

2. The electronic device of claim 1, wherein the deflecting member is fixed to at least one of the first margins and the second margins.

3. The electronic device of claim 1, wherein the deflecting member is provided spaced apart from the housing.

4. The electronic device of claim 1, wherein a heat shield is provided between the housing and the deflecting member.

5. The electronic device of claim 1, wherein the deflecting member is fixed to a casing of the fan.

6. The electronic device of claim 1, wherein the deflecting member is a film-like member.

7. The electronic device of claim 1, wherein
at least one of the heat releasing fins comprises:
a partition wall portion dividing the adjacent gaps; and
a side wall portion connected to a margin of the partition wall portion and cover the gap, and
the deflecting member is fixed to the side wall portion.

8. The electronic device of claim 1, wherein the deflecting member is bent at an end edge of one of the heat releasing fins which is at an end of an array of the heat releasing fins, and is fixed to a surface of the one of the heat releasing fins.

* * * * *